US007368336B2

(12) United States Patent
Lee et al.

(10) Patent No.: US 7,368,336 B2
(45) Date of Patent: May 6, 2008

(54) ORGANIC INSULATOR, ORGANIC THIN FILM TRANSISTOR ARRAY PANEL INCLUDING ORGANIC INSULATOR, AND MANUFACTURING METHOD THEREFOR

(75) Inventors: Yong-Uk Lee, Gyeonggi-do (KR); Kyuha Chung, Seoul (KR); Mun-Pyo Hong, Gyeonggi-do (KR); Do-Yeung Yoon, Seoul (KR); Jong-In Hong, Seoul (KR); Gia Kim, Seoul (KR)

(73) Assignees: Samsung Electronics Co., Ltd., Gyeonggi-do (KR); Seoul National University Industry Foundation, Seoul (KR)

( * ) Notice: Subject to any disclaimer, the term of this patent is extended or adjusted under 35 U.S.C. 154(b) by 224 days.

(21) Appl. No.: 11/313,431

(22) Filed: Dec. 20, 2005

(65) Prior Publication Data

US 2006/0157690 A1    Jul. 20, 2006

(30) Foreign Application Priority Data

Dec. 20, 2004    (KR) .............. 10-2004-0109061

(51) Int. Cl.
  *H01L 21/00*    (2006.01)
(52) U.S. Cl. .............. 438/151; 438/149; 438/585; 257/632; 257/E21.104; 257/E21.409
(58) Field of Classification Search ........ 257/E21.104, 257/E21.37, E21.372, E21.4
See application file for complete search history.

(56) References Cited

U.S. PATENT DOCUMENTS

| 3,962,155 | A | 6/1976 | Usamoto et al. |
| 5,347,144 | A | 9/1994 | Garnier et al. |
| 6,638,378 | B2 | 10/2003 | O'Bryan et al. |

| 2001/0036689 | A1* | 11/2001 | Muroyama ............... 438/149 |
| 2006/0289858 | A1* | 12/2006 | Park et al. ............... 257/40 |
| 2007/0034992 | A1* | 2/2007 | Wariishi et al. ............ 257/632 |

FOREIGN PATENT DOCUMENTS

| JP | 2001-055490 | 2/2001 |
| JP | 2004-262889 | 9/2004 |
| KR | 1020040063176 | 7/2004 |

OTHER PUBLICATIONS

English Language Abstract, WO03052841, Jun. 26, 2003, Corresponding to KR 1020040063176.

* cited by examiner

*Primary Examiner*—Michael Lebentritt
*Assistant Examiner*—Cheung Lee
(74) *Attorney, Agent, or Firm*—MacPherson Kwok Chen & Heid LLP

(57) ABSTRACT

An insulating film according to an embodiment of the present invention has Chemical Formula 1

$$\left[ \begin{array}{c} CH_2 \\ H \\ R \end{array} \begin{array}{c} O \\ H \\ H \end{array} \begin{array}{c} H \\ R \end{array} \begin{array}{c} CH_2R \\ H \\ R \end{array} \begin{array}{c} O \\ H \\ H \end{array} \begin{array}{c} H \\ R \end{array} \begin{array}{c} CH_2R \\ H \\ R \end{array} \begin{array}{c} O \\ H \\ H \end{array} \begin{array}{c} H \\ R \end{array} O \right]_m \quad (1)$$

wherein the Rs are equal to or different from each other, m is an integer, the Rs have Chemical Formula 2:

$$R=(R_1)(R_2)(R_3), \quad (2)$$

and
R1, R2, and R3 in the Chemical Formula 2 are one selected from Chemical Formulae 3, 4 and 5, respectively (n is an integer):

(3)
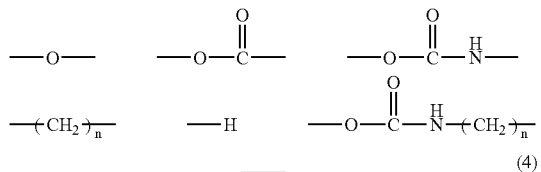
(4)
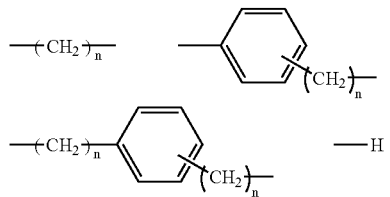
-continued
(5)
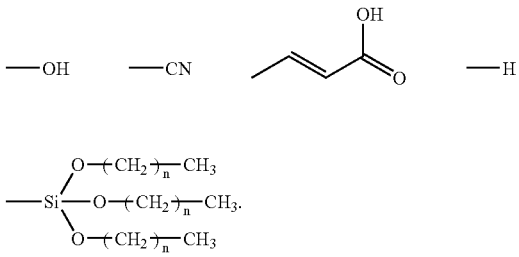
13 Claims, 13 Drawing Sheets

ORGANIC INSULATOR, ORGANIC THIN FILM TRANSISTOR ARRAY PANEL INCLUDING ORGANIC INSULATOR, AND MANUFACTURING METHOD THEREFOR

RELATED APPLICATIONS

This application claims priority from Korean Patent Application Serial Number 10-2004-0109061 filed on Dec. 20, 2004, which is incorporated herein by reference in its entirety.

BACKGROUND OF THE INVENTION (a) Field of the Invention

The present invention relates to electronic displays. More specifically, the present invention relates to electronic displays having an organic insulator, an organic thin film transistor array panel, and a manufacturing method thereof.

(b) Description of Related Art

Efforts currently exist to develop an organic thin film transistor (TFT) including insulators as part of "next generation" displays. The organic TFT includes organic semiconductors and may further include other organic elements such as an organic substrate or organic insulators.

The organic TFT can be manufactured relatively inexpensively by printing a liquid phase organic material and by employing a light. The organic TFT can be formed on flexible plastic substrate to make flexible display devices. In particular, an organic gate insulator, which is disposed between an organic semiconductor and a gate electrode, is developed as a substitute for a conventional gate insulator including silicon oxide or silicon nitride showing poor adhesion with a plastic substrate and requiring high temperature and vacuum.

However, an organic thin film generally allows high leakage current and an organic TFT including conventional organic gate insulators shows low charge carrier mobility. Accordingly, organic gate insulators are not commonly employed in a TFT at this stage, and efforts to improve them continue.

SUMMARY OF THE INVENTION

An insulating film according to an embodiment of the present invention has Chemical Formula 1

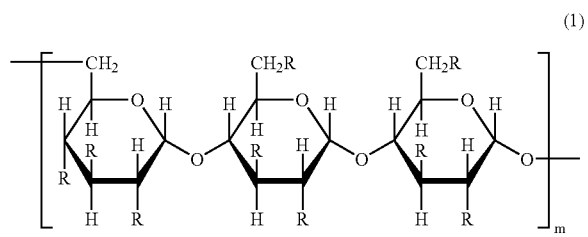

wherein Rs in the Chemical Formula 1 are equal to or different from each other, m is an integer, R has Chemical Formula 2:

$$R = (R_1)(R_2)(R_3) \quad (2),$$

and

R1, R2, and R3 in the Chemical Formula 2 is selected from Chemical Formulae 3, 4 and 5, respectively (n is an integer):

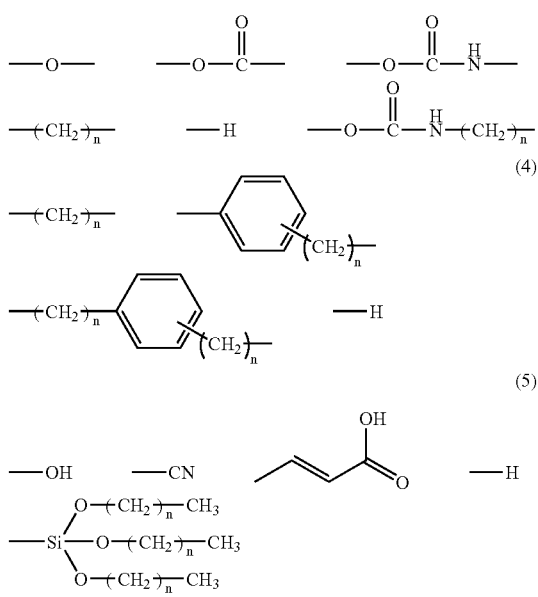

Rs in the Chemical Formula 1 may include —OCO(CH$_2$)$_8$CH$_3$.

Rs in the Chemical Formula 1 may include —OCO(CH$_2$)$_8$CH$_3$ and —CH$_2$CH$_2$CN, and the number of —OCO(CH$_2$)$_8$CH$_3$ may occupy from about 30% to about 100% of the number of Rs in the Chemical Forma 1.

A thin film transistor array panel according to an embodiment of the present invention has: a substrate; a gate line formed on the substrate; a gate insulating layer formed on the gate line; a data line formed on the gate insulating layer; a drain electrode formed on the gate insulating layer; a semiconductor layer formed on or under the data line and the drain electrode; and a pixel electrode connected to the drain electrode, wherein the gate insulating layer comprises a material having Chemical Formula 1

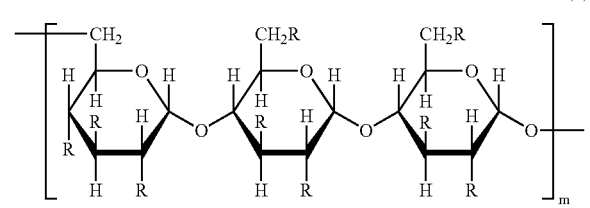

wherein the Rs in the Chemical Formula 1 are equal to or different from each other, m is an integer, the Rs have Chemical Formula 2:

$$R = (R_1)(R_2)(R_3) \quad (2),$$

and

R1, R2, and R3 in the Chemical Formula 2 are selected from Chemical Formulae 3, 4 and 5, respectively (n is an integer):

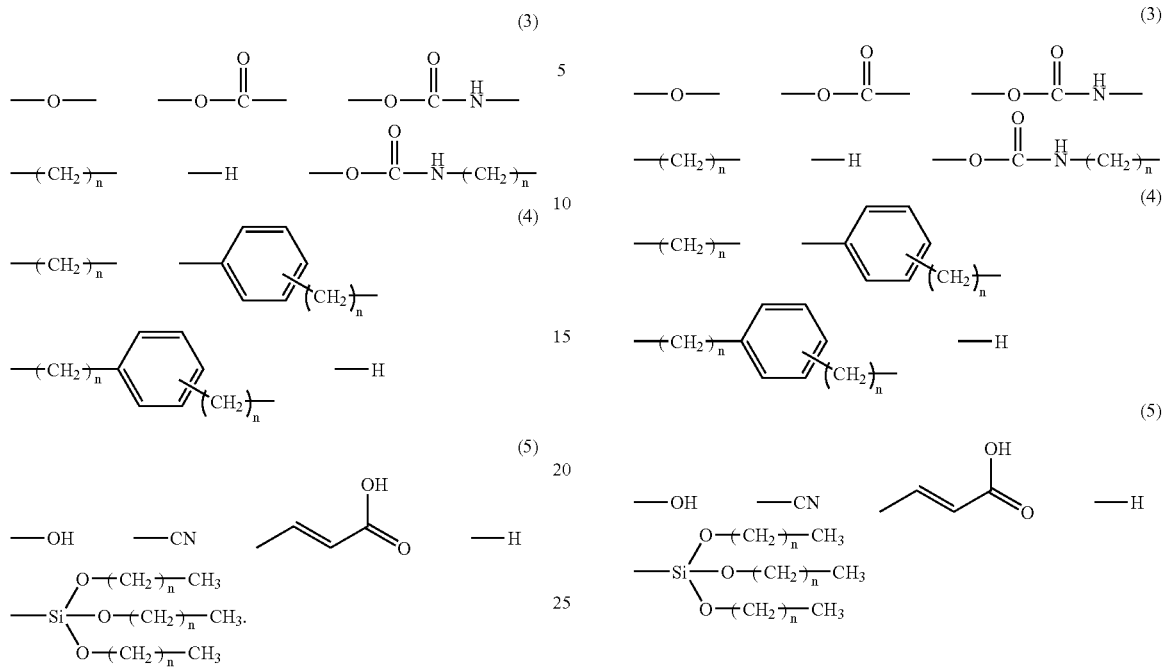

The semiconductor layer may include at least one material selected from the group consisting of pentacene, polythiophene, polyfluorene, copper phthalocyanine and derivatives thereof.

The substrate may include plastic.

A method of manufacturing a thin film transistor array panel according to an embodiment of the present invention includes: forming a gate line on a substrate; forming a gate insulating layer on the gate line; forming a semiconductor layer, a data line, and a drain electrode on the gate insulating layer; and forming a pixel electrode connected to the drain electrode, wherein the gate insulating layer comprises a material having Chemical Formula 1

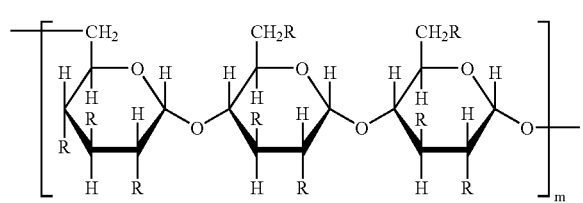

(1)

wherein the Rs in the Chemical Formula 1 are equal to or different from each other, m is an integer, the Rs have Chemical Formula 2:

(2), and

R1, R2, and R3 in the Chemical Formula 2 are selected from Chemical Formulae 3, 4 and 5, respectively (n is an integer):

The gate insulating layer may be formed by spin coating, printing, or dipping.

The semiconductor layer may include at least one material selected from the group consisting of pentacene, polythiophene, polyfluorene, copper phthalocyanine and derivatives thereof.

BRIEF DESCRIPTION OF THE DRAWINGS

The present invention will become more apparent by describing embodiments thereof in detail with reference to the accompanying drawing in which.

Like reference numerals refer to corresponding parts throughout the drawings. Also, it is understood that the depictions in the figures are diagrammatic and not necessarily to scale.

DETAILED DESCRIPTION OF EMBODIMENTS

Figure 1:
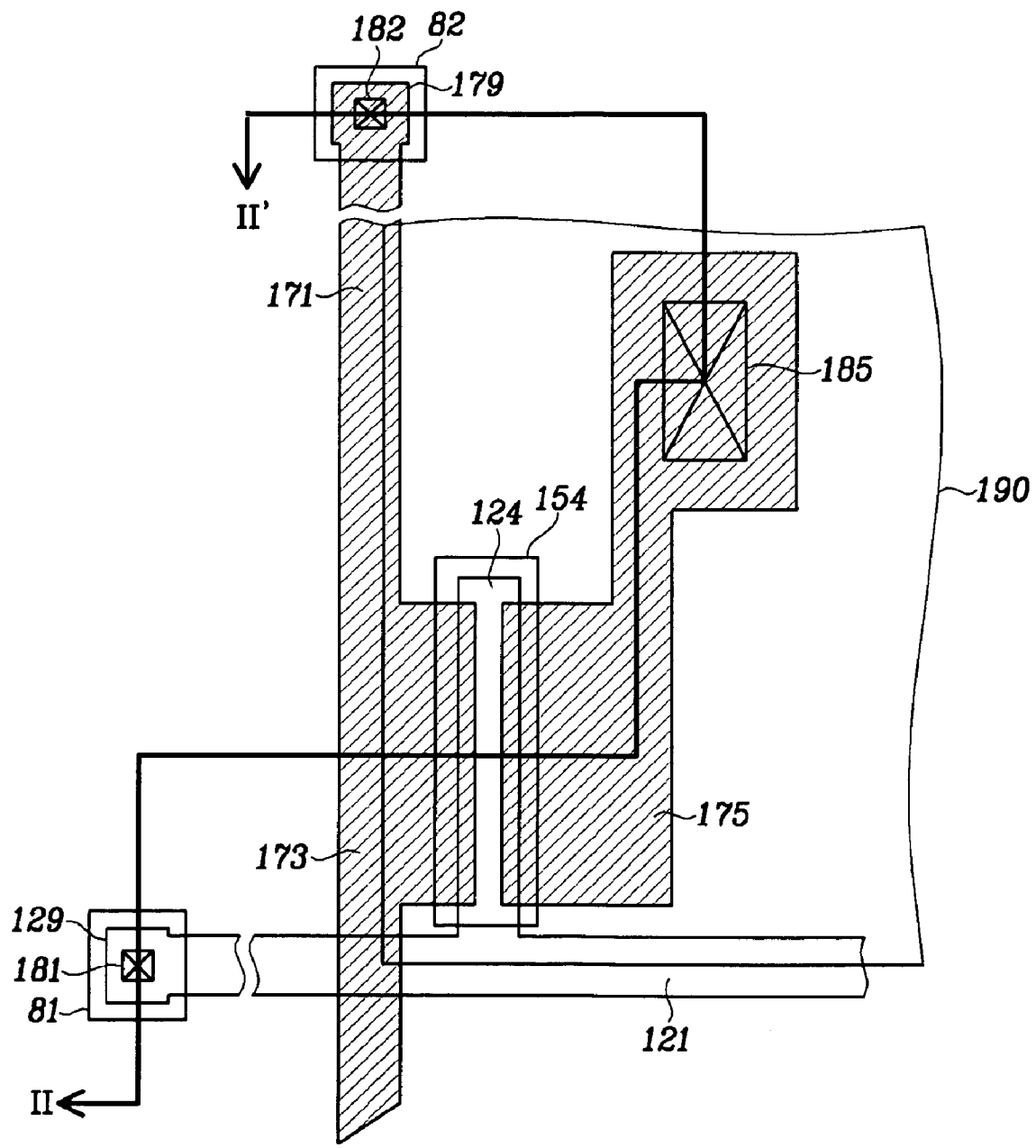
FIG. 1 is a layout view of an organic TFT array panel for a liquid crystal display (LCD) according to an embodiment of the present invention.

The present invention now will be described more fully hereinafter with reference to the accompanying drawings, in which preferred embodiments of the invention are shown. This invention may, however, be embodied in many different forms and should not be construed as limited to the embodiments set forth herein.

In the drawings, the thickness of layers and regions are exaggerated for clarity. It will be understood that when an element such as a layer, region or substrate is referred to as being "on" another element, it can be directly on the other element or intervening elements may also be present. In contrast, when an element is referred to as being "directly on" another element, there are no intervening elements present.

An organic TFT array panel according to an embodiment of the present invention will be described with reference to FIGS. 1 and 2.

Figure 2:
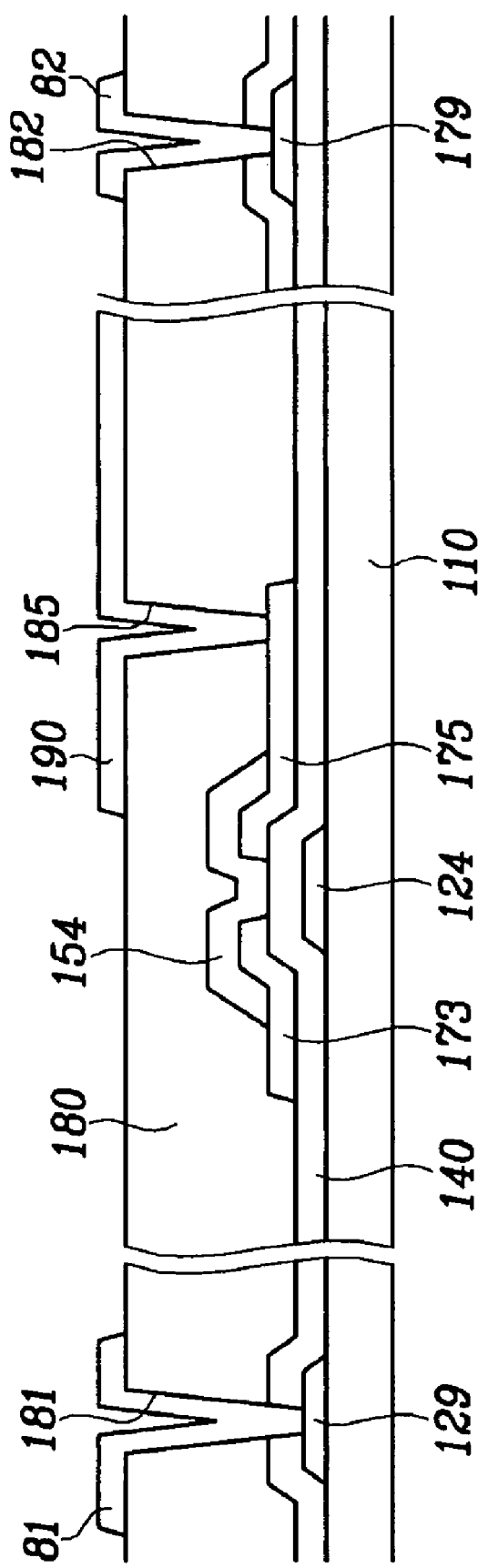
FIG. 2 is a sectional view of the organic TFT array panel shown in FIG. 1 taken along the line II-II'.

FIG. 1 is a layout view of an organic TFT array panel for an LCD according to an embodiment of the present invention, and FIG. 2 is a sectional view of the organic TFT array panel shown in FIG. 1 taken along the line II-II'.

A plurality of gate lines 121 are formed on an insulating substrate 110 such as transparent glass, silicone, or plastic.

The gate lines 121 transmit gate signals and extend substantially in a transverse direction. Each gate line 121 includes a plurality of gate electrodes 124 protruding upward and an end portion 129 having a large area for contact with another layer or a driving circuit. A gate driving circuit (not shown) for generating the gate signals may be mounted on a FPC film (not shown), which may be attached to the substrate 110, directly mounted on the substrate 110, or integrated onto the substrate 110. The gate lines 121 may extend to be connected to a driving circuit that may be integrated on the substrate 110.

The gate lines 121 are preferably made of Al containing metal such as Al and Al alloy, Ag containing metal such as Ag and Ag alloy, Au containing metal such as Au or Au alloy, Cu containing metal such as Cu and Cu alloy, Au containing material such as Au and Au alloy, Mo containing metal such as Mo and Mo alloy, Ni, Pd, Cr, Ta, Ti, conductive oxides such as indium tin oxide (ITO), or conductive polymers such as Baytron P (PEDT:PSS). However, they may have a multi-layered structure including two conductive films (not shown) having different physical characteristics. One of the two films is preferably made of low resistivity metal including Al containing metal, Ag containing metal, and Cu containing metal for reducing signal delay or voltage drop. The other film is preferably made of material such as Mo containing metal, Cr, Ta or Ti, which has good physical, chemical, and electrical contact characteristics with other materials such as ITO or indium zinc oxide (IZO). Good examples of the combination of the two films are a lower Cr film and an upper Al (alloy) film and a lower Al (alloy) film and an upper Mo (alloy) film. However, the gate lines 121 may be made of various metals or conductors.

The lateral sides of the gate lines 121 are inclined relative to a surface of the substrate 110, and the inclination angle thereof ranges about 30-80 degrees.

A gate insulating layer 140 is formed on the gate lines 121. The gate insulating layer 140 may be made of organic insulator that can be processed in a liquid phase by spin coating, (inkjet) printing, etc. Examples of the inorganic insulator include a material having Chemical Formula 1.

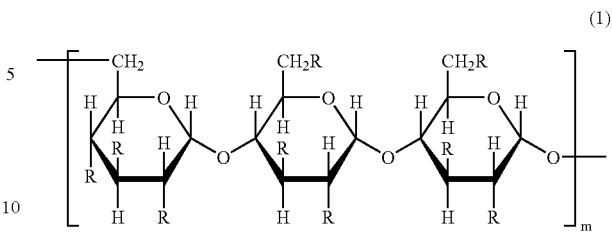

where each of Rs has Chemical Formula 2:

In Chemical Formula 2, R1, R2, and R3 is one selected from Chemical Formulae 3, 4 and 5, respectively:

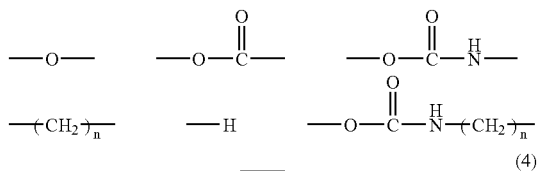

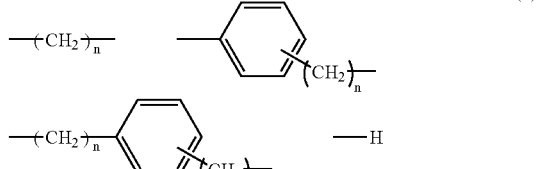

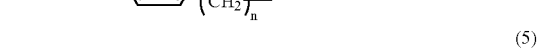

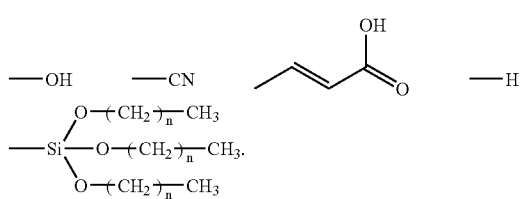

Rs in Chemical Formula 1 may have the same structure or different structures.

The organic material represented by Chemical Formula 1 includes side chains. The organic material alkyl group in side chains causes hydrophobicity and low moisture absorption and the acrylate group or the silane group allows crosslinking.

In particular, R in Chemical Formula 1 preferably includes —OCO(CH$_2$)$_8$CH$_3$. Alternatively, Rs in Chemical Formula 1 preferably include —OCO(CH$_2$)$_8$CH$_3$ and —CH$_2$CH$_2$CN and the number of —OCO(CH$_2$)$_8$CH$_3$ is preferably larger than about 30% of the total number of Rs.

The above-described organic material can be processed in the liquid phase by spin coating, printing, dipping, etc., and thus is suitable for use in large screen display devices. In particular, it is suitable for a flexible display device including a plastic substrate as compared with silicon oxide, since the plastic substrate is vulnerable to high temperature and vacuum.

In addition, the above-described organic material generally has a larger dielectric constant than silicon oxide.

A plurality of data lines 171 and a plurality of drain electrodes 175 are formed on the gate insulating layer 140.

The data lines 171 transmit data signals and extend substantially in a longitudinal direction to intersect the gate lines 121. Each data lines 171 includes a plurality of source electrodes 173 projecting toward the gate electrodes 124, and an end portion 179 having a large area for contact with another layer or an external driving circuit. A data driving circuit (not shown) for generating the data signals may be mounted on an FPC film (not shown), which may be attached to the substrate 110, directly mounted on the substrate 110, or integrated onto the substrate 110. The data lines 171 may extend to be connected to a driving circuit that may be integrated on the substrate 110.

The drain electrodes 175 are separated from the data lines 171 and disposed opposite the source electrodes 173 with respect to the gate electrodes 124.

The data lines 171 and the drain electrodes 175 are preferably made of Al containing metal such as Al and Al alloy, Ag containing metal such as Ag and Ag alloy, Au containing metal such as Au or Au alloy, Cu containing metal such as Cu and Cu alloy, Au containing material such as Au and Au alloy, Mo containing metal such as Mo and Mo alloy, Ni, Pd, Cr, Ta, Ti, conductive oxides such as ITO, or conductive polymers such as Baytron P. However, they may have a multi-layered structure including two conductive films (not shown) having different physical characteristics. One of the two films is preferably made of low resistivity metal including Al containing metal, Ag containing metal, and Cu containing metal for reducing signal delay or voltage drop. The other film is preferably made of material such as Mo containing metal, Cr, Ta or Ti, which has good physical, chemical, and electrical contact characteristics with other materials such as ITO or IZO. However, the data lines 171 and the drain electrodes 175 may be made of various metals or conductors.

The data lines 171 and the drain electrodes 175 have inclined edge profiles, and the inclination angles thereof range about 30-80 degrees.

A plurality of organic semiconductor islands 154 are formed on the source electrodes 173, the drain electrodes 175, and the gate insulating layer 140. The organic semiconductor islands 154 are disposed on the gate electrodes 124 and contact the source electrodes 173 and the drain electrodes 175. The organic semiconductor islands 154 fully cover the gate electrodes 124 such that the edges of the gate electrodes 124 overlap the organic semiconductor islands 154.

The organic semiconductor islands 154 may include high molecular compound or low molecular compound, which is soluble in an aqueous solution or organic solvent. The organic semiconductor islands 154 can be formed by inkjet printing, by deposition such as spin coating, or by lithography with or without etch.

The organic semiconductor islands 154 may be made of or from derivatives of pentacene, polythiophene, polyfluorene, copper phthalocyanine.

A gate electrode 124, a source electrode 173, and a drain electrode 175 along with an organic semiconductor islands 154 form an organic TFT having a channel formed in the organic semiconductor islands 154 disposed between the source electrode 173 and the drain electrode 175.

A passivation layer 180 is formed on the organic semiconductor islands 154, the data lines 171, the drain electrodes 175, and the gate insulating layer 140. The passivation layer 180 is preferably made of an inorganic insulator such as silicon nitride or silicon oxide, organic insulator, or low dielectric insulator. The organic insulator and the low dielectric insulator preferably have dielectric constants less than about 4.0, and the low dielectric insulator includes a-Si:C:O and a-Si:O:F formed by plasma enhanced chemical vapor deposition (PECVD). The organic insulator for the passivation 180 may be photosensitive, and the passivation 180 may have a flat surface. The passivation layer 180 may include a lower film made of an inorganic insulator and an upper film made of organic insulator, such that it has the excellent insulating characteristics of the organic insulator while preventing the exposed portions of the organic semiconductor islands 154 from being damaged by the organic insulator.

The passivation layer 180 has a plurality of contact holes 182 and 185 exposing the end portions 179 of the data lines 171 and the drain electrodes 175, respectively. The passivation layer 180 and the gate insulating layer 140 have a plurality of contact holes 181 exposing the end portions 129 of the gate lines 121.

A plurality of pixel electrodes 190 and a plurality of contact assistants 81 and 82 are formed on the passivation layer 180. They are preferably made of a transparent conductor such as ITO or IZO, or a reflective conductor such as Ag, Al, or alloys thereof.

The pixel electrodes 190 are physically and electrically connected to the drain electrodes 175 through the contact holes 185, such that the pixel electrodes 190 receive data voltages from the drain electrodes 175. Upon receiving the data voltages, the pixel electrodes 190 generate electric fields in cooperation with a common electrode (not shown) of an opposing display panel (not shown) supplied with a common voltage. This electric field determines the orientations of liquid crystal molecules (not shown) in a liquid crystal layer (not shown) that is disposed between the two electrodes. A pixel electrode 190 and the common electrode form a capacitor referred to as a "liquid crystal capacitor," which stores applied voltages after the TFT turns off.

The pixel electrodes 190 overlap the gate lines 121 and the data lines 171 to increase the aperture ratio.

The contact assistants 81 and 82 are connected to the end portions 129 of the gate lines 121 and the end portions 179 of the data lines 171 through the contact holes 181 and 182, respectively. The contact assistants 81 and 82 protect the end portions 129 and 179 and enhance adhesion between the end portions 129 and 179 and external devices.

Now, a method of manufacturing the organic TFT array panel shown in FIGS. 1 and 2 according to an embodiment of the present invention will be described in detail with reference to FIGS. 3-12 as well as FIGS. 1 and 2.

FIGS. 3, 5, 7 and 9 are layout views illustrating process steps in the fabrication of the TFT array panel shown in FIGS. 1 and 2. FIG. 4 is a sectional view of the TFT array panel shown in FIG. 3 taken along the line IV-IV'; FIG. 6 is a sectional view of the TFT array panel shown in FIG. 5 taken along the line VI-VI'; FIG. 8 is a sectional view of the TFT array panel shown in FIG. 7 taken along the line VIII-VIII'; and FIG. 10 is a sectional view of the TFT array panel shown in FIG. 9 taken along the line X-X'.

Figure 3:
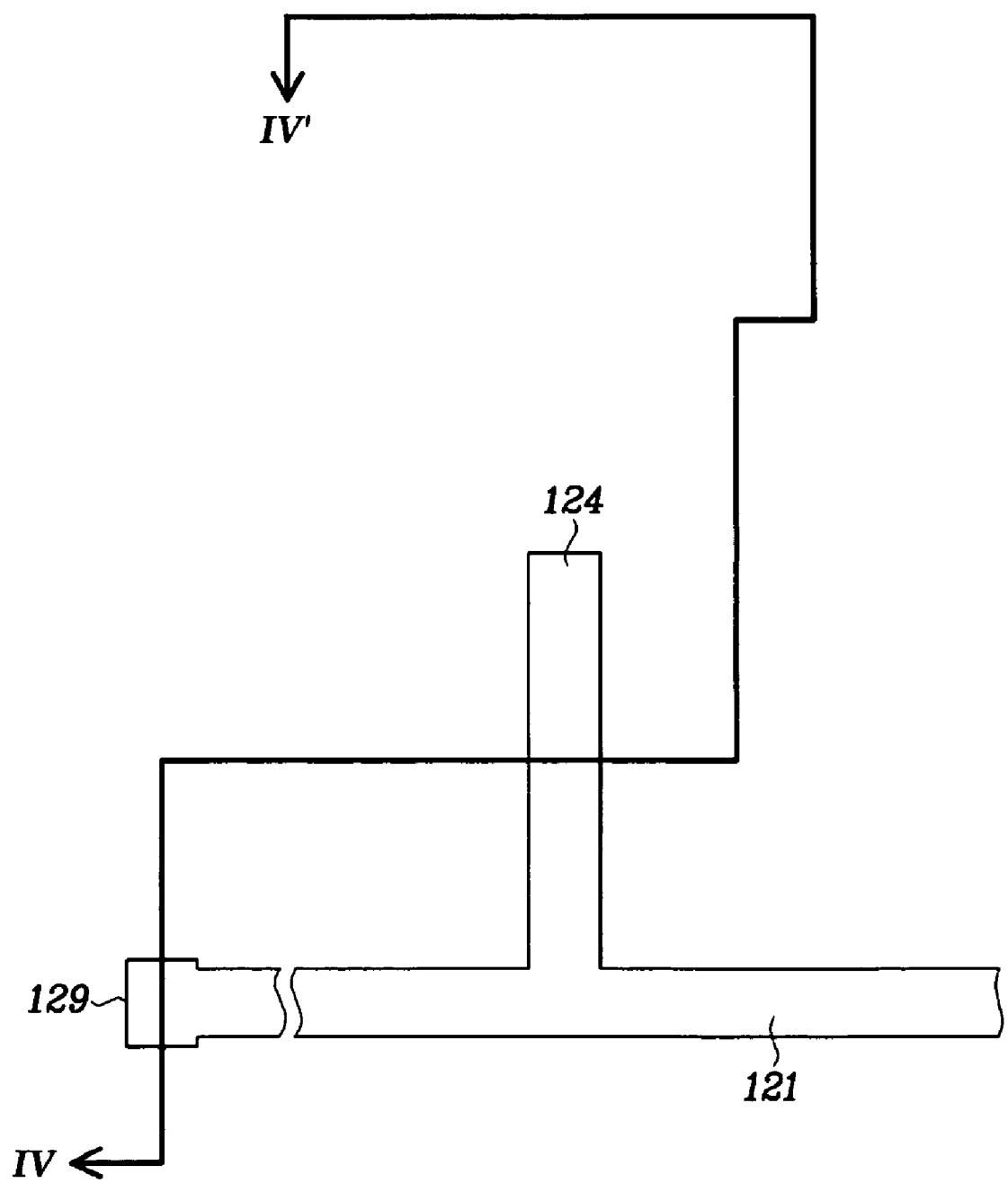
FIGS. 3, 5, 7 and 9 are layout views of a TFT array panel shown in FIGS. 1 and 2 in intermediate steps of a manufacturing method thereof according to an embodiment of the present invention.
Figure 4:
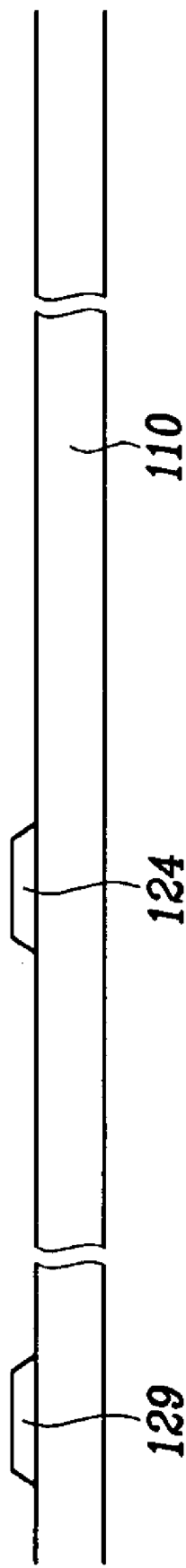
FIG. 4 is a sectional view of the TFT array panel shown in FIG. 3 taken along the line IV-IV'.

Referring to FIGS. 3 and 4, a plurality of gate lines 121, including gate electrodes 124 and end portions 129, is formed on an insulating substrate 110.

Figure 5:
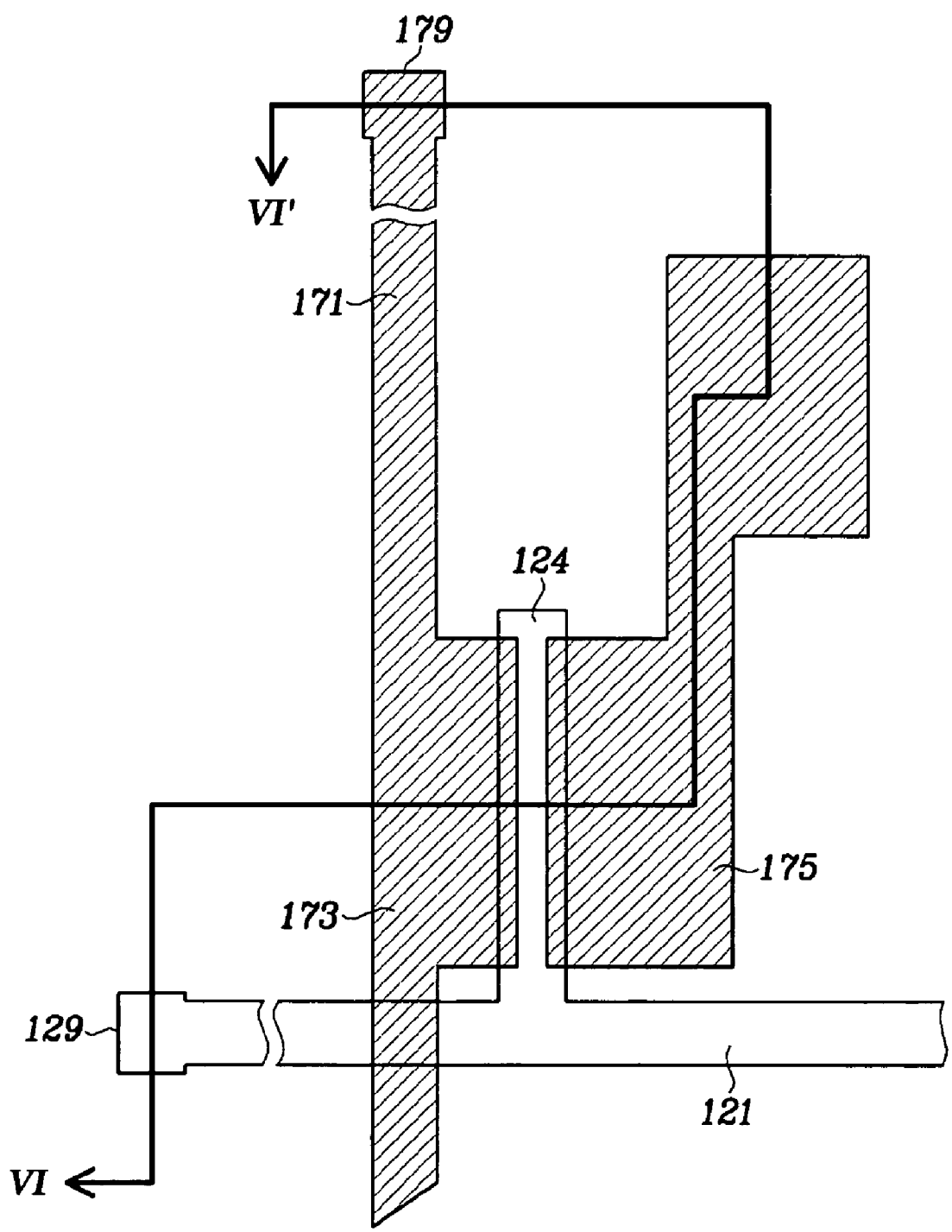
Figure 6:
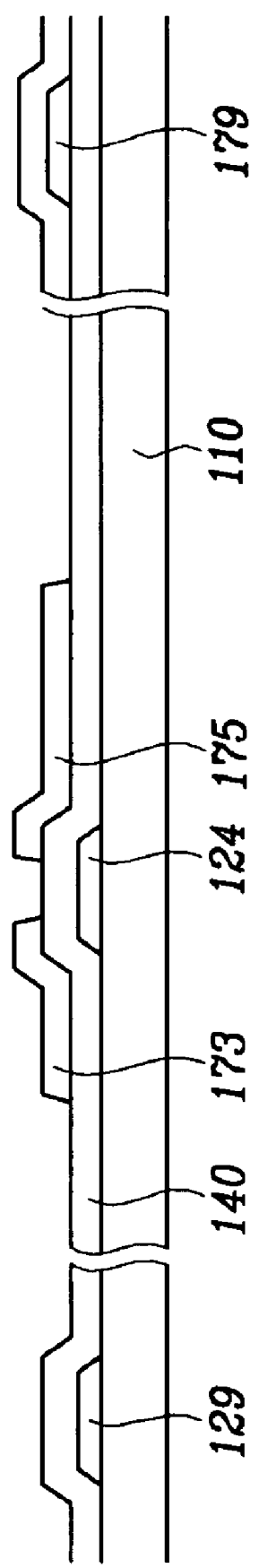
FIG. 6 is a sectional view of the TFT array panel shown in FIG. 5 taken along the line VI-VI'.

Referring to FIGS. 5 and 6, an organic material having Chemical Formula 1 is dissolved into a solvent and deposited by spin coating, (inkjet) printing, etc to form a gate insulating layer 140. Thereafter, a plurality of data lines 171 including source electrodes 173 and end portions 179 and a plurality of drain electrodes 175 preferably made of Au are formed by deposition with a shadow mask (as is known, they may also be formed by deposition, lithography, or etching).

Figure 7:
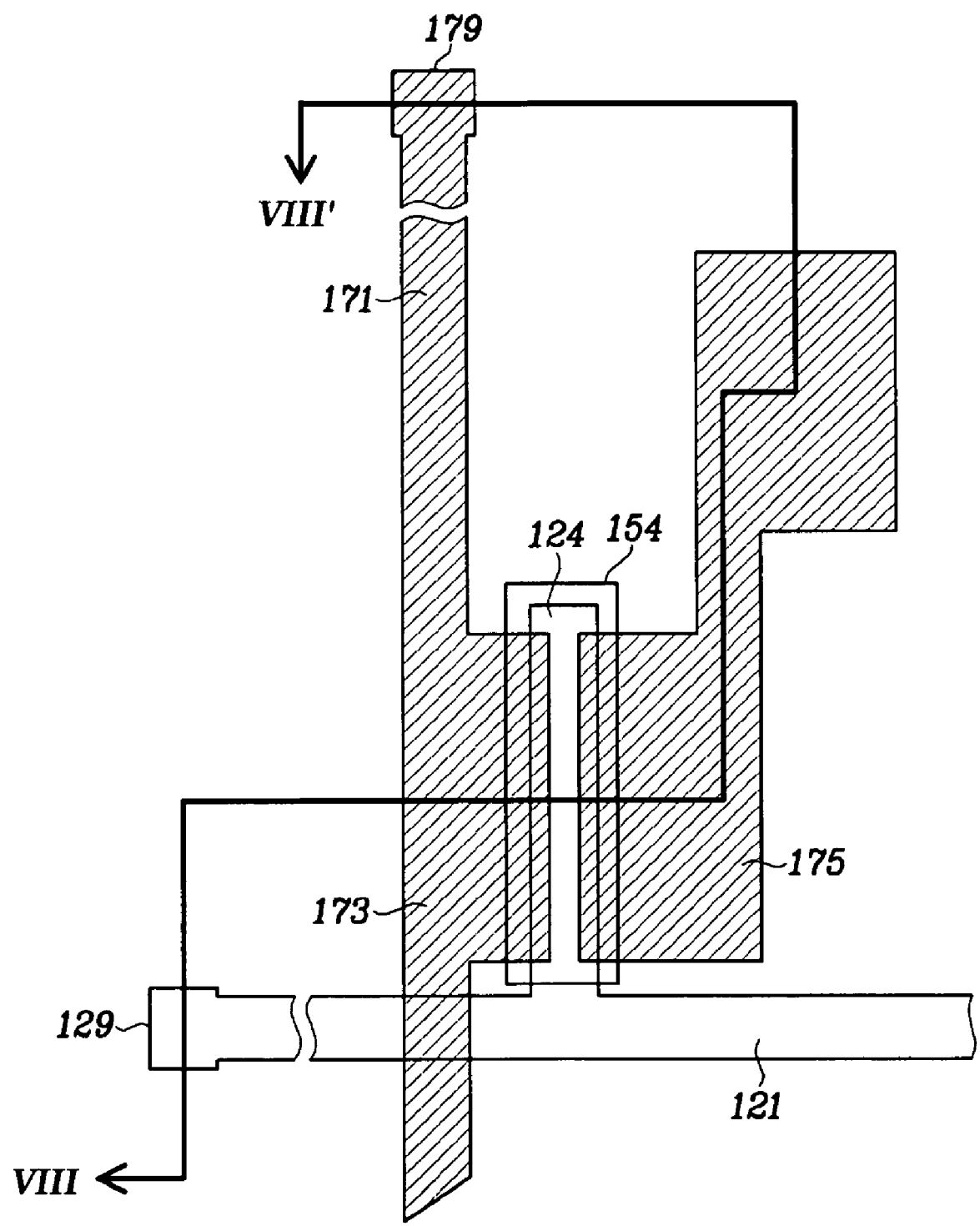
Figure 8:
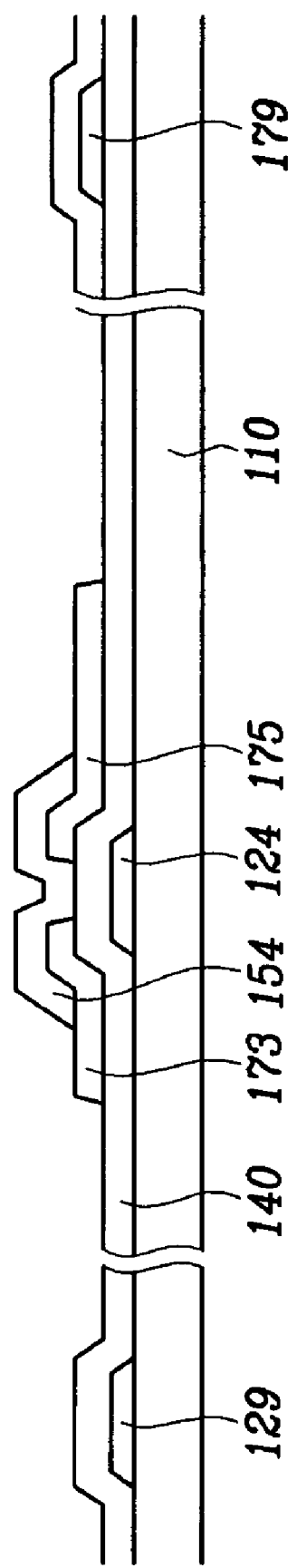
FIG. 8 is a sectional view of the TFT array panel shown in FIG. 7 taken along the line VIII-VIII'.

Referring to FIGS. 7 and 8, a plurality of organic semiconductor islands 154 are formed by deposition, lithography, and etching, or by shadow masking and deposition, or by (inkjet) printing. The deposition methods for an organic semiconductor layer include thermal evaporation, molecular beam deposition, vapor deposition, vacuum sublimation, CVD, PECVD, reactive deposition, sputtering, spin coating, etc.

Figure 9:
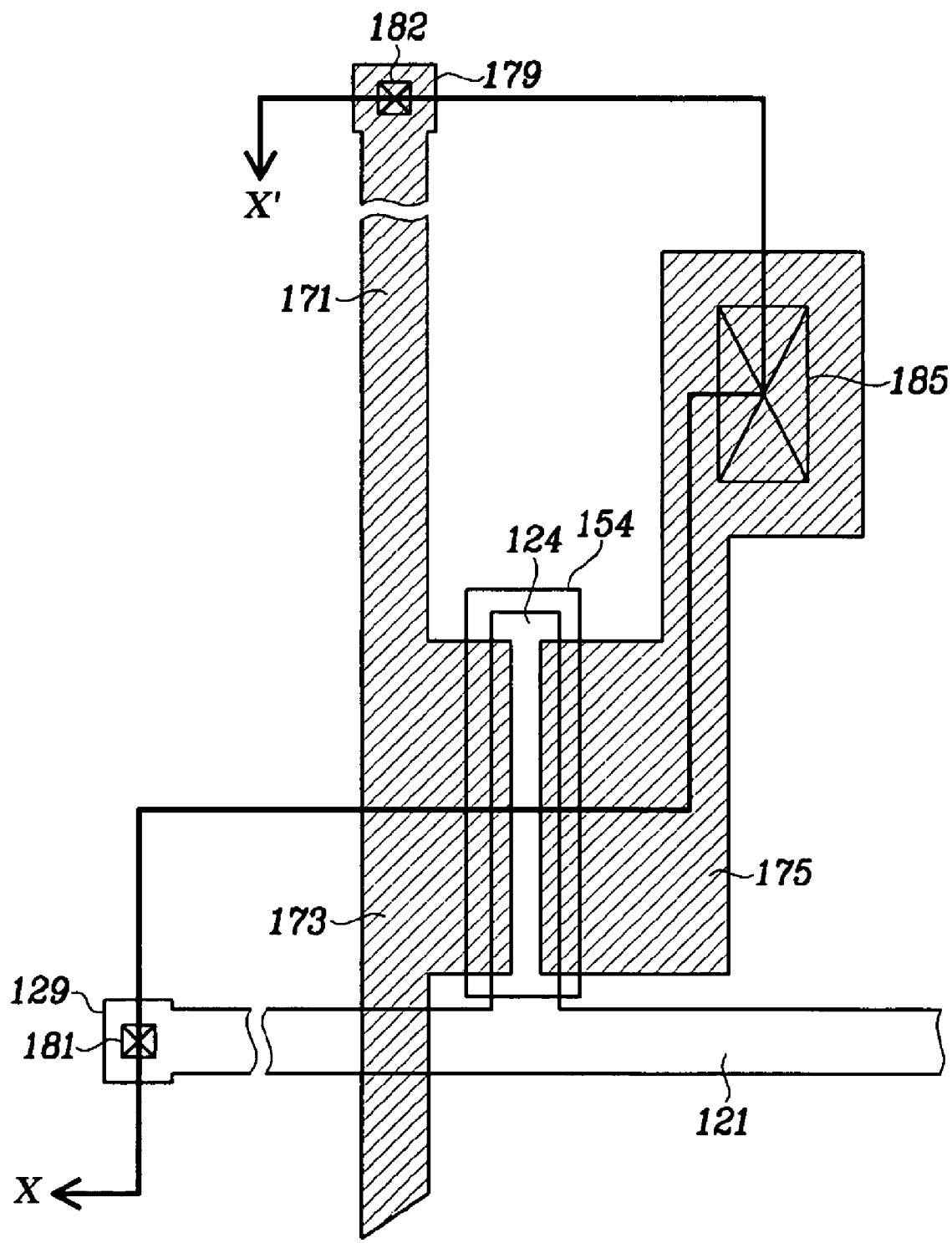
Figure 10:
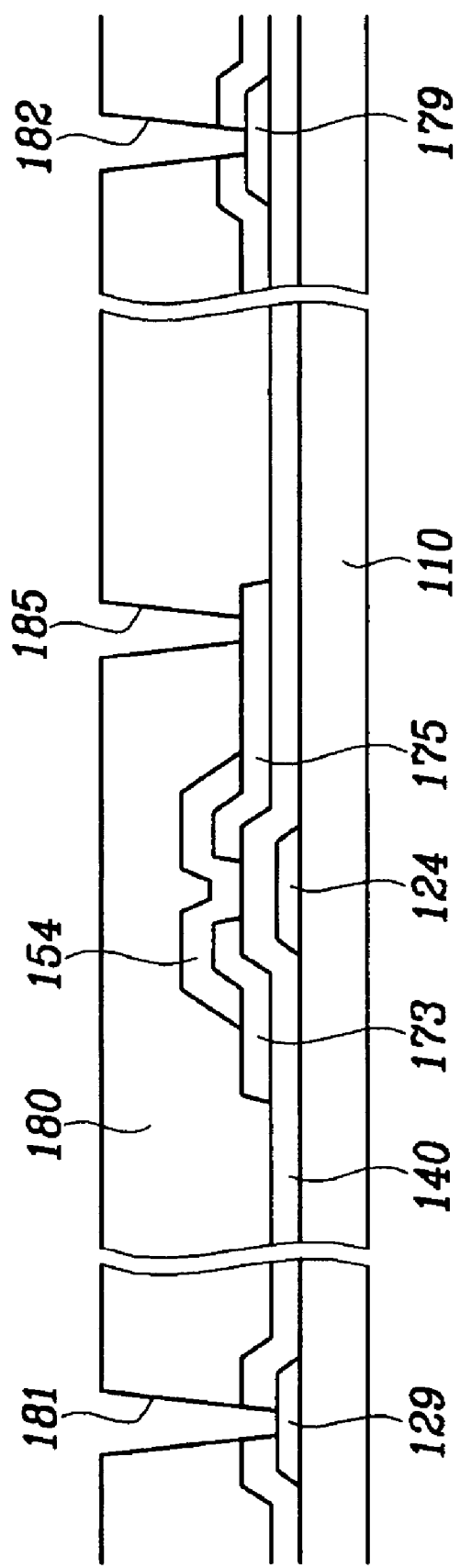
FIG. 10 is a sectional view of the TFT array panel shown in FIG. 9 taken along the line X-X'.

Referring to FIGS. 9 and 10, a passivation layer 180 is deposited and patterned along with the gate insulating layer 140 to form a plurality of contact holes 181, 182 and 185 exposing the end portions 129 of the gate lines 121, the end portions 179 of the data lines 171, and the drain electrodes 175, respectively.

Finally, a plurality of pixel electrodes 190 and a plurality of contact assistants 81 and 82 are formed on the passivation layer 180 as shown in FIGS. 1 and 2.

Exemplary TFT Fabrication

Embodiments of TFTs configured in accordance with the invention having been explained, attention now turns to exemplary processes for fabricating such TFTs. One of ordinary skill in the art will realize that the following processes merely illustrate examples of how to fabricate TFTs according to the invention, and that the invention is not limited to these fabrication processes. One of such skill will realize that other processes for fabricating such TFTs exist, as well. Furthermore, one of such skill will realize that the invention is not limited to the various values of process variables used (i.e., temperature values, pressure values, and the like). Other values can be employed as appropriate.

Figure 11:
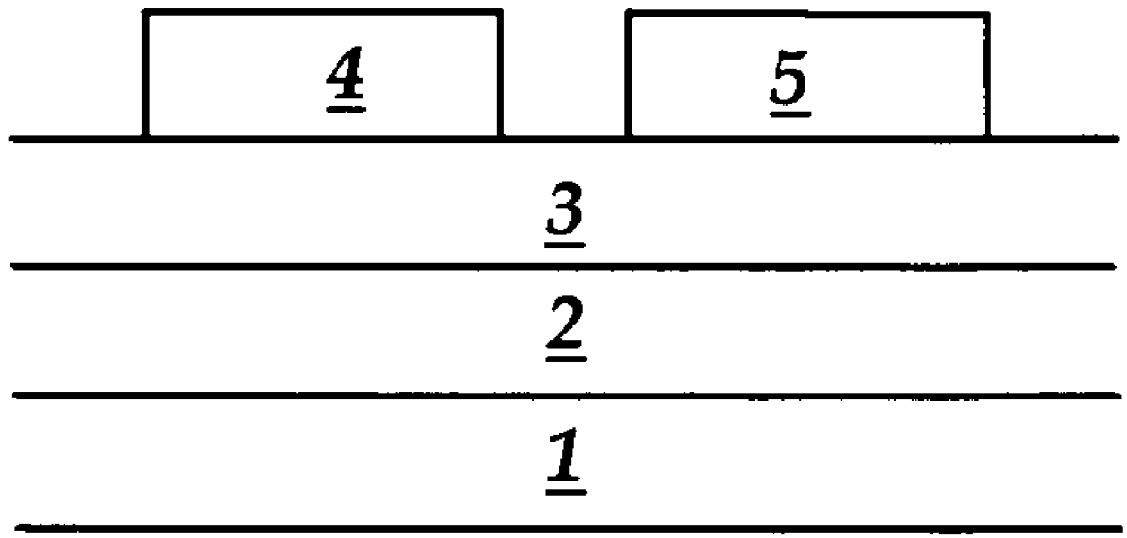
FIG. 11 shows two different organic TFTs.

Two different organic TFTs 10 shown in FIG. 11 were fabricated. One TFT (TFT 1) has a gate insulating layer 2 made of organic material having Chemical Formula 1, and the other TFT (TFT 2) has a gate insulating layer 2 made of silicon dioxide ($SiO_2$). Each of the fabricated organic TFTs has a channel length of about a hundred microns, and a channel width of about one millimeter.

For TFT 1, an organic compound having Chemical Formula 1 that includes Rs consisting of about 30% —OCO$(CH_2)_8CH_3$ and about 70% —$CH_2CH_2CN$ was solved by about 5 wt % in cyclohexanone. The solution was then spin coated at a thickness of about 5,000 Å to form an organic gate insulating layer 2 on a heavily doped silicon wafer 1 that serves as a gate electrode.

For TFT 2, a silicon dioxide film having a thickness of about 2,000 Å was formed by thermal oxidation to form a gate insulating layer 2 on a heavily doped silicon wafer 1 that serves as a gate electrode. The gate insulating layer 2 was then cleaned.

For each of TFT 1 and TFT 2, pentacene was deposited on the gate insulating layer 2 at a deposition rate of about 0.5 Å/sec by thermal evaporation, in a vacuum of about $10^{-6}$ torr and at a temperature of about 15° C., so as to form an organic semiconductor thin film 3 having a thickness of about 600 Å. A source electrode 4 and a drain electrode 5 made of Au were formed on the organic semiconductor thin film by using a shadow mask.

The dielectric constant of the gate insulating layers 2 at a frequency of 1 MHz was measured for the TFTs. The measured dielectric constant of TFT 1 was equal to about 11.5 for TFT 1, which is about three times the measured dielectric constant of TFT 2 equal to about 4.

The electrical characteristics of the TFTs 10 were measured by using a HP4156A Semiconductor Parameter Analyzer manufactured by Hewlett Packard.

Figure 12:
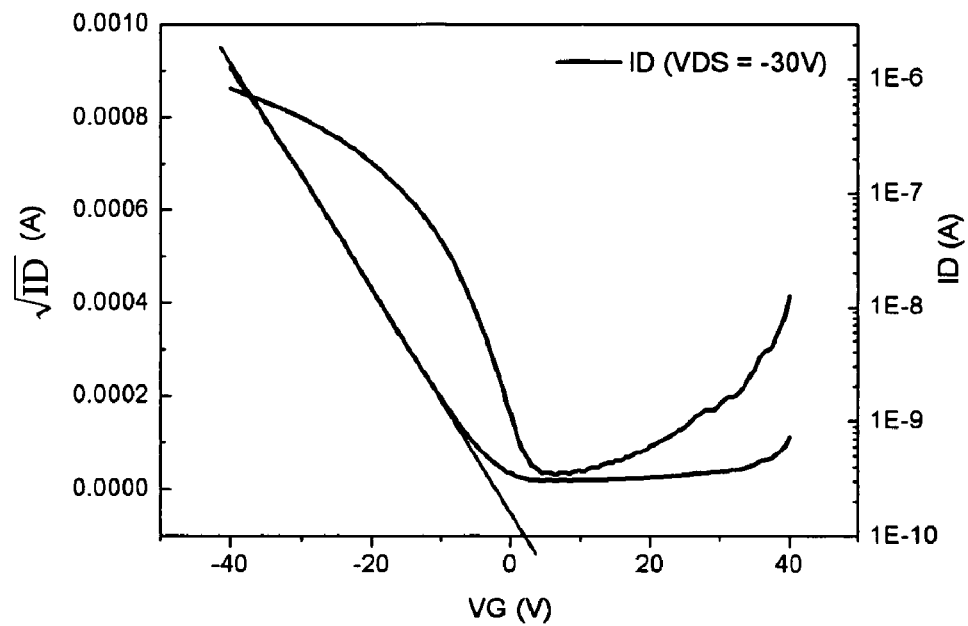
FIGS. 12 and 13 are graphs illustrating a drain current ID and square root $(I_D)^{1/2}$ of the drain current ID.
Figure 13:
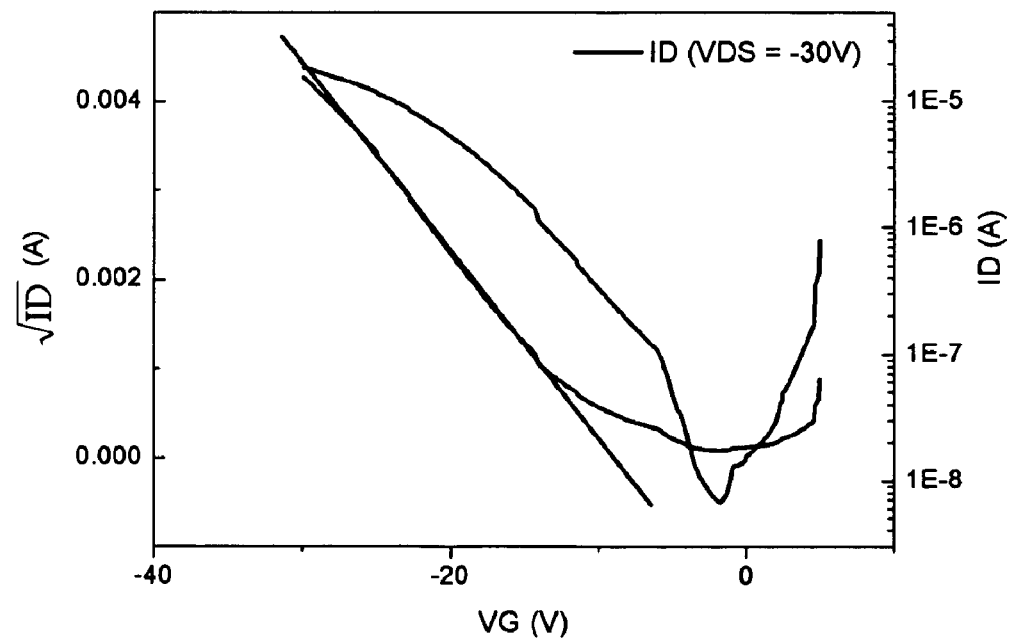
Figure 14:
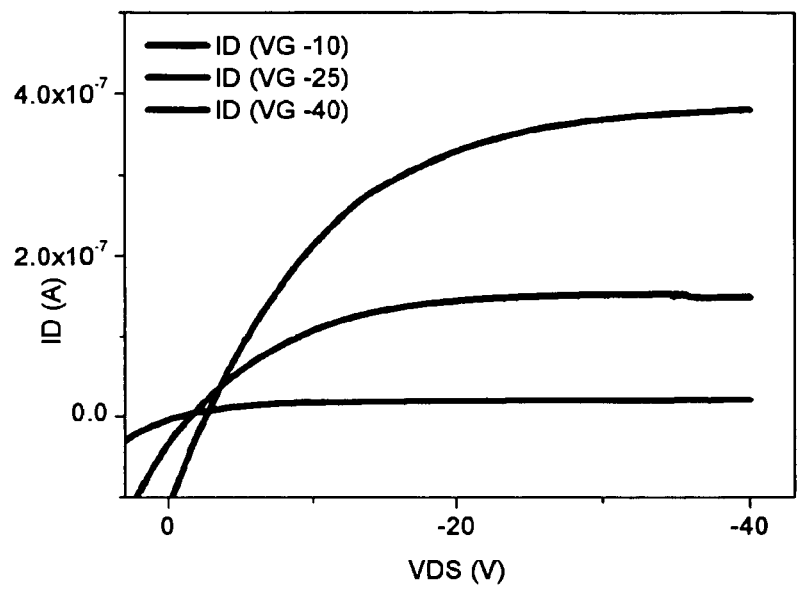
FIGS. 14 and 15 are graphs showing a drain current ID as function of source-drain voltage, which indicates the output characteristics.
Figure 15:
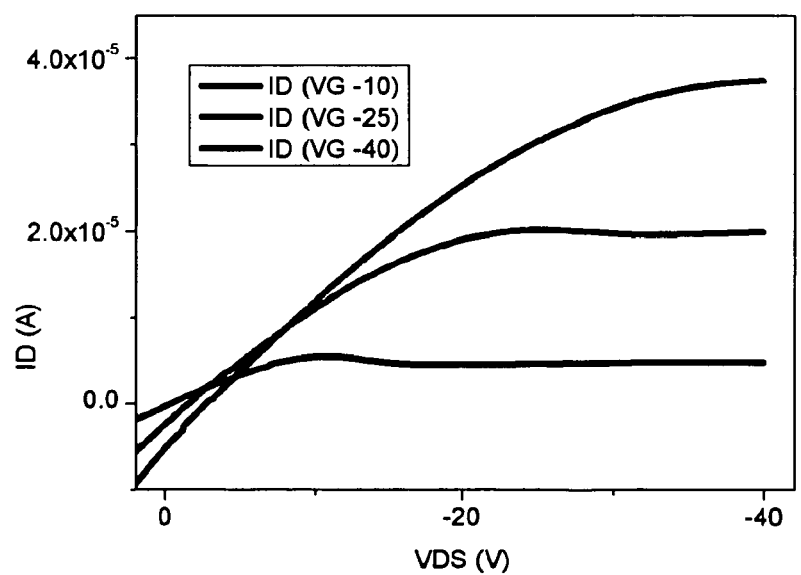

FIGS. 12 and 13 are graphs illustrating a drain current ID and square root $(I_D)^{1/2}$ of the drain current ID, and FIGS. 14 and 15 are graphs showing a drain current ID as a function of source-drain voltage, which indicates the output characteristics.

Referring to FIGS. 12-15, an OTFT including a gate insulating layer of silicon nitride has a threshold voltage equal to about -2V, a mobility equal to about 0.016 $cm^2/Vs$, and an on/off current ratio equal to about $10^3$. In contrast, an inventive OTFT including an organic insulating layer according to an embodiment of the present invention has a threshold voltage equal to about -9V, a mobility equal to about 1.8 $cm^2/Vs$, and an on/off current ratio equal to about $3\times10^3$.

Accordingly, the OTFT according to an embodiment of the present invention has remarkably improved output characteristics and transfer characteristics.

The present invention can be employed to any display devices including LCD and OLED.

Although preferred embodiments of the present invention have been described in detail hereinabove, it should be clearly understood that many variations and/or modifications of the basic inventive concepts herein taught which may appear to those skilled in the present art will still fall within the spirit and scope of the present invention, as defined in the appended claims.

What is claimed is:

1. An insulating film having Chemical Formula 1

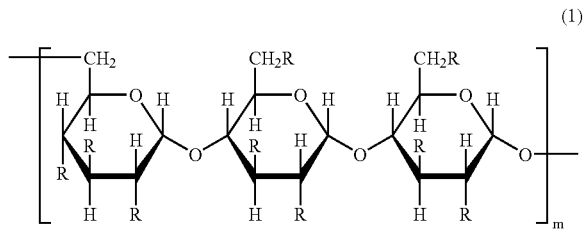

wherein the Rs are equal to or different from each other, m is an integer, the Rs have Chemical Formula 2:

and

R1, R2, and R3 in the Chemical Formula 2 are selected from Chemical Formulas 3, 4 and 5, respectively (n is an integer):

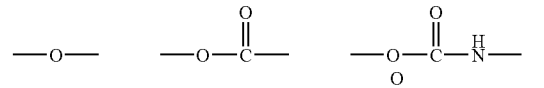
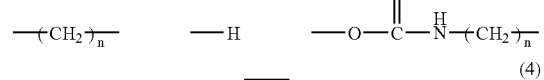
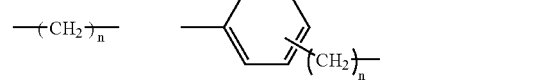
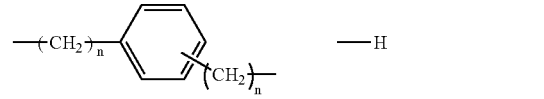
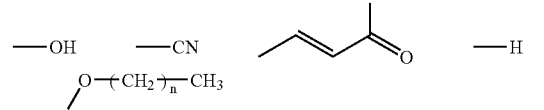

2. The organic insulating film of claim 1, wherein the Rs in the Chemical Formula 1 comprise —OCO$(CH_2)_8CH_3$.

3. The organic insulating film of claim 1, wherein the Rs in the Chemical Formula 1 comprise —OCO(CH$_2$)$_8$CH$_3$ and —CH$_2$CH$_2$CN.

4. The organic insulating film of claim 3, wherein at least about 30% of the Rs in the Chemical Formula 1 comprise —OCO(CH$_2$)$_8$CH$_3$.

5. A thin film transistor array panel comprising:
a substrate;
a gate line formed on the substrate;
a gate insulating layer formed on the gate line;
a data line formed on the gate insulating layer;
a drain electrode formed on the gate insulating layer;
a semiconductor layer formed on or under the data line and the drain electrode; and
a pixel electrode connected to the drain electrode,
wherein the gate insulating layer comprises a material having Chemical Formula 1

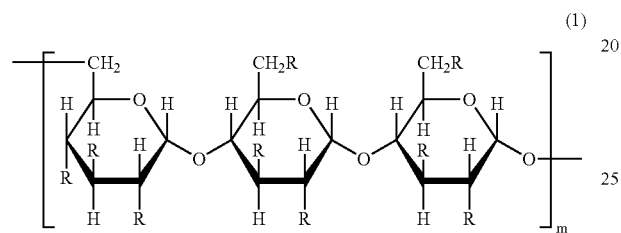
(1)

wherein the Rs are equal to or different from each other, m is an integer, the Rs have Chemical Formula 2:

(2);

and
R1, R2, and R3 in the Chemical Formula 2 are selected from Chemical Formulas 3, 4 and 5, respectively (n is an integer),

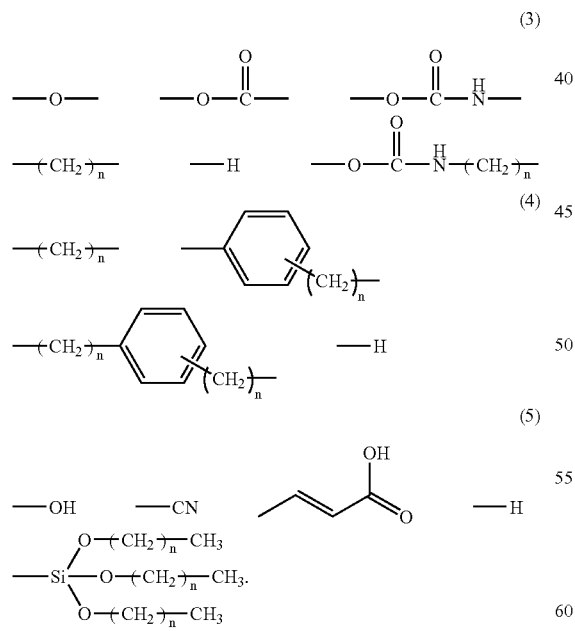
(3)
(4)
(5)

6. The organic insulating film of claim 5, wherein the Rs in the Chemical Formula 1 comprise —OCO(CH$_2$)$_8$CH$_3$.

7. The organic insulating film of claim 5, wherein the Rs in the Chemical Formula 1 comprise —OCO(CH$_2$)$_8$CH$_3$ and —CH$_2$CH$_2$CN.

8. The organic insulating film of claim 7, wherein at least about 30% of the Rs in the Chemical Formula 1 comprise —OCO(CH$_2$)$_8$CH$_3$.

9. The thin film transistor array panel of claim 5, wherein the semiconductor layer comprises at least one material selected from the group consisting of pentacene, polythiophene, polyfluorene, copper phthalocyanine, and derivatives thereof.

10. The thin film transistor array panel of claim 5, wherein the substrate comprises plastic.

11. A method of manufacturing a thin film transistor array panel, the method comprising:
forming a gate line on a substrate;
forming a gate insulating layer on the gate line;
forming a semiconductor layer, a data line, and a drain electrode on the gate insulating layer; and
forming a pixel electrode connected to the drain electrode,
wherein the gate insulating layer comprises a material having Chemical Formula 1

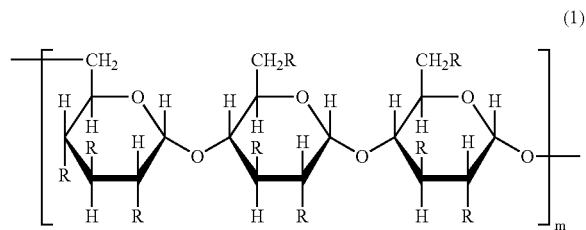
(1)

wherein the Rs are equal to or different from each other, m is an integer, the Rs have Chemical Formula 2:

(2), and
R1, R2, and R3 in the Chemical Formula 2 are selected from Chemical Formulas 3, 4 and 5, respectively (n is an integer):

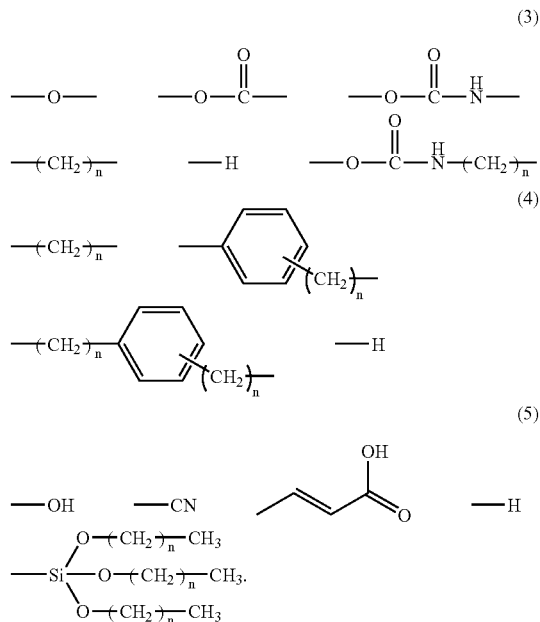
(3)
(4)
(5)

12. The method of claim 11, wherein the gate insulating layer is formed by at least one of spin coating, printing, or dipping.

13. The method of claim 11, wherein the semiconductor layer comprises at least one material selected from the group consisting of pentacene, polythiophene, polyfluorene, copper phthalocyanine, and derivatives thereof.

* * * * *